United States Patent
Urban et al.

(10) Patent No.: US 7,785,486 B2
(45) Date of Patent: *Aug. 31, 2010

(54) METHOD OF ETCHING STRUCTURES INTO AN ETCHING BODY USING A PLASMA

(75) Inventors: Andrea Urban, Stuttgart (DE); Franz Laermer, Weil der Stadt (DE); Klaus Breitschwerdt, Filderstadt (DE); Volker Becker, Marxzell (DE)

(73) Assignee: Robert Bosch GmbH, Stuttgart (DE)

( * ) Notice: Subject to any disclaimer, the term of this patent is extended or adjusted under 35 U.S.C. 154(b) by 1397 days.

This patent is subject to a terminal disclaimer.

(21) Appl. No.: 10/676,295

(22) Filed: Sep. 30, 2003

(65) Prior Publication Data
US 2004/0124177 A1    Jul. 1, 2004

(30) Foreign Application Priority Data
Sep. 14, 2001  (DE)  ............... 101 45 297
Mar. 6, 2003   (DE)  ............... 103 09 711

(51) Int. Cl.
G01L 21/30   (2006.01)
B44C 1/22    (2006.01)
C23F 1/00    (2006.01)

(52) U.S. Cl. .................. 216/59; 216/67; 216/79; 438/689; 438/706; 438/710

(58) Field of Classification Search .......... 216/59, 216/67, 79; 438/689, 710, 706
See application file for complete search history.

(56) References Cited

U.S. PATENT DOCUMENTS

| 4,799,991 A | * | 1/1989 | Dockrey | .............. 438/719 |
| 4,863,549 A | * | 9/1989 | Grunwald | ............ 156/345.44 |
| 5,290,383 A | * | 3/1994 | Koshimizu | ........... 156/345.25 |
| 5,437,895 A |   | 8/1995 | Kodama et al. | |
| 5,486,993 A |   | 1/1996 | Sakurai et al. | |
| 5,683,538 A | * | 11/1997 | O'Neill et al. | ......... 156/345.28 |
| 5,711,814 A |   | 1/1998 | Mori | |

(Continued)

FOREIGN PATENT DOCUMENTS

DE   42 41 045   5/1994

(Continued)

OTHER PUBLICATIONS

Wolf, Stanley: Silicon processing for the VLSI ERA: vol. 1, pp. 568-569, 1986.*

(Continued)

*Primary Examiner*—Shamim Ahmed
(74) *Attorney, Agent, or Firm*—Kenyon & Kenyon LLP

(57) ABSTRACT

Additional variants of the method of etching structures into an etching body, in particular recesses in a silicon body that are laterally defined in a precise manner by an etching mask, using a plasma, is described. In addition, the use of this method in the introduction of structures, in particular trenches having a high aspect ratio, into a dielectric layer or a dielectric base body and in a layer of silicon is described, isotropic underetching and/or isotropic, sacrificial-layer etching, in particular using fluorine radicals or a highly oxidizing fluorine compound such as $ClF_3$, being performed after the production of the structures in at least some areas in the case of the layer made of silicon.

20 Claims, 11 Drawing Sheets

U.S. PATENT DOCUMENTS

| | | | |
|---|---|---|---|
| 5,779,925 A * | 7/1998 | Hashimoto et al. | 216/67 |
| 5,827,435 A * | 10/1998 | Samukawa | 216/69 |
| 5,880,034 A | 3/1999 | Keller | |
| 5,888,414 A * | 3/1999 | Collins et al. | 216/68 |
| 5,938,854 A * | 8/1999 | Roth | 134/1 |
| 5,997,687 A | 12/1999 | Koshimizu | |
| 6,060,329 A * | 5/2000 | Kamata et al. | 438/9 |
| 6,077,787 A * | 6/2000 | Reinhard et al. | 438/697 |
| 6,093,332 A * | 7/2000 | Winniczek et al. | 216/2 |
| 6,110,287 A | 8/2000 | Arai et al. | |
| 6,143,476 A * | 11/2000 | Ye et al. | 430/318 |
| 6,187,685 B1 * | 2/2001 | Hopkins et al. | 438/710 |
| 6,214,162 B1 | 4/2001 | Koshimizu | |
| 6,218,196 B1 * | 4/2001 | Ise et al. | 438/689 |
| 6,231,777 B1 * | 5/2001 | Kofuji et al. | 216/71 |
| 6,593,244 B1 * | 7/2003 | Wang et al. | 438/706 |
| 6,720,268 B1 * | 4/2004 | Laermer et al. | 438/700 |
| 6,777,037 B2 | 8/2004 | Sumiya et al. | |
| 6,926,844 B1 * | 8/2005 | Laermer et al. | 216/67 |
| 6,962,844 B2 | 11/2005 | Stasiak | |
| 2002/0114897 A1 * | 8/2002 | Sumiya et al. | 427/569 |
| 2003/0070759 A1 * | 4/2003 | Aota et al. | 156/345.43 |
| 2004/0124177 A1 | 7/2004 | Urban et al. | |
| 2004/0173571 A1 * | 9/2004 | Laermer | 216/67 |

FOREIGN PATENT DOCUMENTS

| | | | |
|---|---|---|---|
| DE | 199 27 806 | | 1/2001 |
| DE | 199 33 842 | | 2/2001 |
| DE | 199 57 169 | | 6/2001 |
| DE | 19957169 | * | 6/2001 |
| DE | 100 51 831 | | 5/2002 |
| DE | 101 45 297 | | 4/2003 |
| EP | 0 140 294 | | 5/1985 |
| EP | 1 153 425 | | 11/2001 |
| JP | 262-7131 | | 1/1987 |
| JP | 2-174229 | | 7/1990 |
| JP | 7-142400 | | 6/1995 |
| JP | 8-022981 | | 1/1996 |
| JP | 408020880 A | * | 1/1996 |
| JP | 8-083776 | | 3/1996 |
| JP | 9-263948 | | 10/1997 |
| JP | 2000 150483 | | 5/2000 |
| KR | 2000-0060991 | | 10/2000 |
| KR | 2001 0075207 | | 8/2001 |
| WO | WO 97/14177 | | 4/1997 |
| WO | WO 01/39261 | * | 5/2001 |

OTHER PUBLICATIONS

J. Taillet, "Plasma Physics: ion energy in RF plasma etching" Physics abstracts, 1979 (see p. L-224).*

Ohtake Hiroto et al., "Charge-free etching process using positive and negative ions (ambipolar diffusion of ions) in pulse-time modulated electron cyclotron resonance plasma with low-frequency bias"- Applied Physics Letters, 68, 2416 (1996).*

J.I. Ulacia et al., "The Physics of Plasma Etching", Physica Scripta. vol. T35, 299-308, 1991.*

V. P. Derkach et al., "Modeling of Plasma etching in Microelectronics", Journal :Cybernetics and System Analysis, vol. 26, No. 5, Sep. 1990.*

* cited by examiner

SiO2, PL

PTFE, SiO2

Si

19

SiO2, PL

PTFE, SiO2

Si

19

SiO2

Si

SiO2

Si

METHOD OF ETCHING STRUCTURES INTO AN ETCHING BODY USING A PLASMA

FIELD OF THE INVENTION

The present invention relates to a method of etching structures into an etching body, in particular recesses in a silicon body that are laterally defined in a precise manner, using a plasma.

BACKGROUND INFORMATION

In plasma etching, a known problem resulting from electric charge buildup is the development of pockets on a dielectric interface which functions as an etch barrier. This "notching phenomenon" limits the aspect ratios of trenches such as those needed for micromechanical structures, because the overetching times allowed without the development of "notches" or "pockets" become progressively shorter as the aspect ratio (ratio of depth to width) increases. Therefore, for a process that is reliable in production, values of approx. 5:1 to 10:1 are currently thought to be the aspect ratio limit, depending on the geometry of the structure, so that yaw rate sensors, for example, are implemented not by using optimum layer thicknesses of more than 20 µm but instead with epi-polysilicon layers approx. 10 µm to 15 µm thick, thus severely restricting the design and performance of these components.

FIG. 1 illustrates the cause of the occurrence of pockets. Electrons strike the surface that is to be etched, i.e., etching layer 61 of a substrate 19 essentially in an undirected manner and are absorbed by the side walls of the etched structures, in particular in the upper portions of trenches having a high aspect ratio. Positively charged ions, however, strike surface 61 almost perpendicularly and in a directed manner, so that a high percentage of ions reaches the bottom of the trench. This directed ion incidence is ultimately the cause of the desired etching anisotropy; however, vertical walls cannot be etched. As long as the etching base is still made of silicon, for example, this does not have any serious consequences. Electrons absorbed by the upper portion of the side wall simply migrate downward in the conductive silicon to the etching base, where they neutralize the positively charged incident ions. However, as soon as a dielectric interface 60, which acts an etch barrier, is reached, this equalizing current is no longer able to reach the ions trapped at dielectric interface 60, resulting in strong fields between the etching base and the side walls of the structure. To an increasing extent, these fields deflect the following ions into the silicon-dielectric transitional area, which is then the driving factor in the development of pockets.

To overcome this problem, it was already proposed in German Published Patent Application No. 199 57 169 that the substrate be given an opportunity to discharge during the pulse pauses by pulsing the substrate bias voltage, i.e., the high- or low-frequency substrate electrode power supplied to the substrate electrode.

Due to the pulsation of the power, i.e., voltage, applied to the substrate electrode, an intermittent ionic current is achieved and the development of harmful charges and resulting electric fields is counteracted by discharge processes in the current pauses. Pocket suppression essentially becomes more effective, the longer the pulse pauses (=discharge times) and at the same time the shorter the pulse periods (=buildup of charges), although this drives up the pulse peak power required during the pulse pauses for the continued progress of anisotropic etching. This approach of supplying the ion acceleration voltage required for anisotropic etching to the substrate electrode in shorter and shorter pulses, which are of a higher voltage accordingly, also results in a loss of process stability, i.e., the occurrence of roughness in the etching base, even including "grass formation" on the etching base. This can be counteracted in part by adjusting the voltage-current ratio for the power supplied to the substrate electrode in favor of a higher voltage and lower current, as is possible in low-frequency biasing at frequencies of 100 kHz to 450 kHz, for example. This procedure in particular enlarges the allowed process window in the direction of a lower pulse-period ratio before roughness begins to occur in the etching base. Unfortunately, this approach has some disadvantages: the plasma impedance is very high; high quality is required of the matching network (matchbox) to accomplish the necessary voltage transformation; the matching itself is unstable and depends to a great extent on the plasma characteristics, and the ion energy spectrum thus generated is broad in relation to the substrate electrode, which makes profile control of anisotropically etched structures difficult.

In summary, the disadvantages listed above are kept within limits and/or partially overcome by low-frequency pulsing of a high-frequency modulated high-frequency power, e.g., 13.56 MHz according to German Published Patent Application No. 199 57 169, and the associated emulation of a low-frequency bias voltage of 100 kHz to 450 kHz, for example, but suppression of pocket formation at a dielectric etch barrier at high aspect ratios of more than 10:1 is still limited.

SUMMARY OF THE INVENTION

The object of the present invention is to provide additional variants of the method and/or exemplary embodiments for etching structures into an etching body based on the unpublished German Patent Application No. 101 45 297, such that these variants result in improved pocket stability, in particular at high aspect ratios of the etched structures, and thus allow high overetching times with these structures as well.

The present invention, in continuation of German Patent Application No. 101 45 297, describes novel possibilities for process management with the goal of suppressing problems in plasma etching, in particular when such problems result from electric charge buildup in plasma etching of silicon. This eliminates several problem phenomena associated with plasma etching. In particular the underlying cause of these phenomena, the electric charge buildup, is eliminated.

It has thus been recognized as essential that the limited effect of substrate bias pulsing results from the fact that most of the negative charge carriers in a plasma are formed by electrons, whereas most of the positive charge carriers are cations, which are heavy ions having a positive charge. Anions, i.e., negatively charged ions, constitute only a very small portion of the charge particles in a "normal" plasma. Since the mass of cations (and anions) is approximately 100,000 times greater than that of an electron, and charge carrier mobility is a function of mass, a plasma always has a positive plasma potential of typically 10 V to 20 V with respect to surfaces coming in contact with the plasma. This plasma potential repels negative charge carriers, i.e., electrons and anions, and attracts cations, so that cations always reach the substrate to be etched with a minimum energy of approx. 10 eV to 20 eV, even when the substrate bias voltage is turned off. The substrate to be etched always has a negative bias with respect to the plasma, so that for the reasons given above, this negative bias is pulled further in the negative direction for the above-mentioned reasons when an additional substrate power, i.e., substrate bias voltage, is applied, and this results in a negative "self-bias voltage," which is essentially desired.

Thus, even with the acceleration voltage turned off, only directed ions and undirected electrons are able to reach the substrate, which limits the efficacy of substrate bias pulse pauses according to German Published Patent Application No. 199 57 169 for discharging structures, i.e., it drives the pause times required for discharge into unfeasible ranges.

It is also advantageous that the method according to the present invention, regardless of specific etching methods, is suitable for a number of applications, e.g., etching dielectric layers, opening of etching base passivation without damage to side wall passivation or use in etching operations based on chlorine or bromine chemistry while eliminating attack on side walls and undercutting beneath the edge of the mask. In particular, in addition to use in a silicon etching method according to German Patent No. 42 41 045 and its further embodiments, this method may also be used in structuring silicon dioxide or other dielectrics, contact hole etching and/or creating vias in $SiO_2$ or other dielectrics and Teflon passivation of side walls of structures.

DETAILED DESCRIPTION

To implement the exemplary embodiments explained below, the plasma etching system as described in German Patent Application No. 101 45 297 shall be assumed here. In particular, the reference numbers used there are also used here with the same meanings, so they need not be explained again here.

Figure 2:
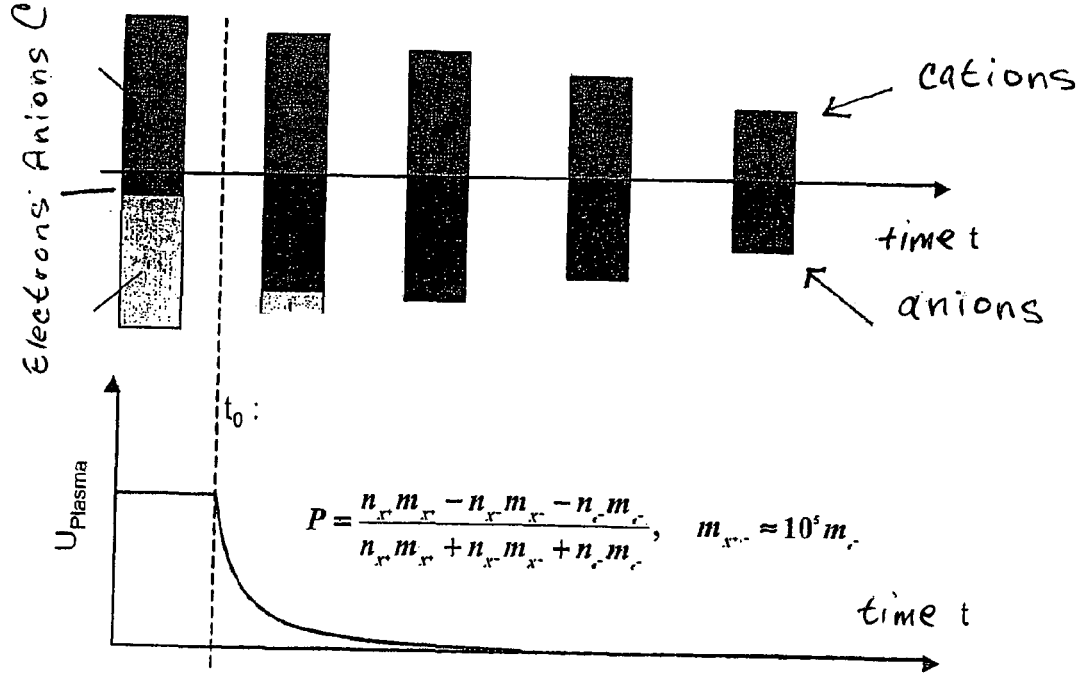
FIG. 2 illustrates the effects which occur when a plasma such as an inductively coupled plasma or a microwave plasma is turned off.

FIG. 2 shows the effects which occur in the pulse pause when a plasma is turned off, in particular when a pulsed plasma is turned off. First, starting from a "normal plasma" composed of a low density of anions and a high density of electrons and cations during the pulse period, the plasma is temporarily turned off at time $t_0$. In the pulse pause which then begins, the electron gas in the plasma cools down within a few microseconds, resulting in recombination of electrons with cations to some extent and a paired loss of both species, but on the other hand, a substantial portion of the electrons is also captured by neutral gas molecules, forming anions. This effect is supported by a drastic increase in the capture cross section of low-energy electrons after cooling the electron gas and by the electronegativity of the gas molecules involved. For the usual process gases in plasma etching of silicon or silicon dioxide, e.g., $SF_6$, $Cl_2$, HCl, HBr, $SiC_4$, $SiF_4$, $C_4F_8$, $C_3F_6$, $C_4F_6$, $C_5F_8$, $CF_4$, $CHF_3$, $C_2F_6$, $C_3F_8$, $O_2$, $N_2$, the electronegativity is high, i.e., there is a marked tendency accordingly to form anions in the presence of "cold" electrons having a sufficiently low energy. Therefore, a few :s after shutting down the plasma energization, the plasma already contains practically only anions and cations and has very few free electrons. This state persists for a relatively long period of time, i.e., the anion and cation concentrations decline exponentially over time t to zero due to impact neutralization, the time constant possibly being a few 10's of μs to a few 100 μs, depending on the pressure and the gas species involved.

The formula in the bottom part of FIG. 2 describes polarity P of the plasma, i.e., the normalized asymmetry of the masses of positive and negative charge carriers. For a "normal" plasma, the polarity is at first close to 1, because the electron masses $m_e$ are insignificant with respect to the cation masses $m_{x+}$, and the anion concentration $n_{x-}$ is very low. When the plasma is turned off, however, polarity P of the plasma drops very rapidly to 0, i.e., an ambipolar condition prevails.

As an essential consequence of the approximate equality of masses of the positive and negative charge carriers in the ambipolar plasma, plasma potential $U_{plasma}$ also drops to zero, i.e., the curve of polarity P over time corresponds in trend to the variation of plasma potential $U_{plasma}$ over time diagramed here, which drops from approx. 10 V to 20 V to a value close to 0 V within a few microseconds.

The consequences of this ambipolar state are serious. Without an applied substrate voltage, i.e., in the absence of a substrate bias power, there is no longer any potential difference between the plasma and the substrate, so that both cations and anions having a very low energy are able to act on the substrate and discharge it in any location where there is a harmful charge agglomeration.

The exemplary embodiments presented here make use of this finding using a pulsed plasma power and substrate bias power according to German Patent Application No. 101 45 297.

Moreover, the following exemplary embodiments are preferably used for implementing the method according to German Patent No. 42 41 045 in anisotropic etching of silicon.

Figure 1:
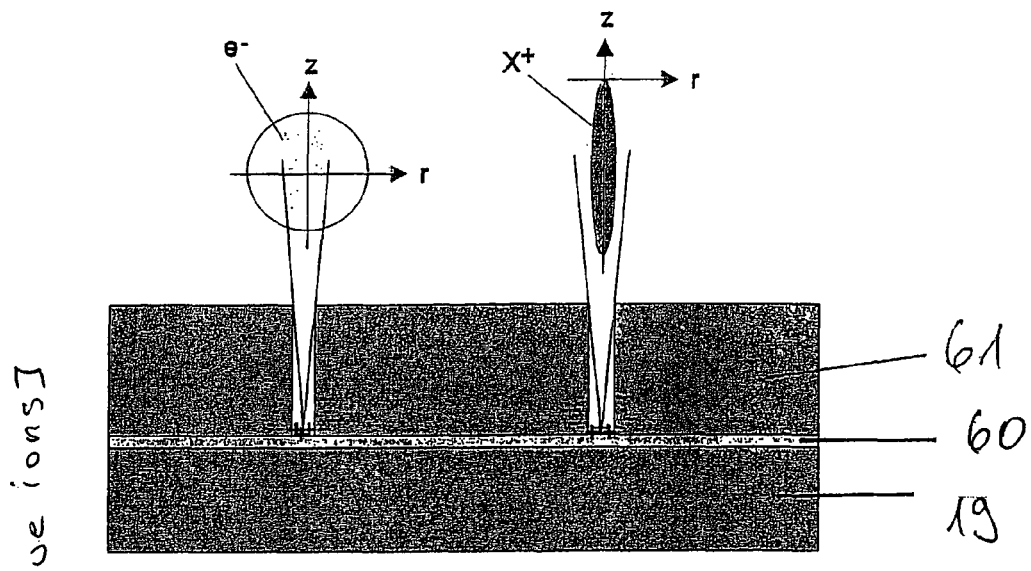
FIG. 1 shows a diagrammatic sketch of the cause of pocket formation.
Figure 3:
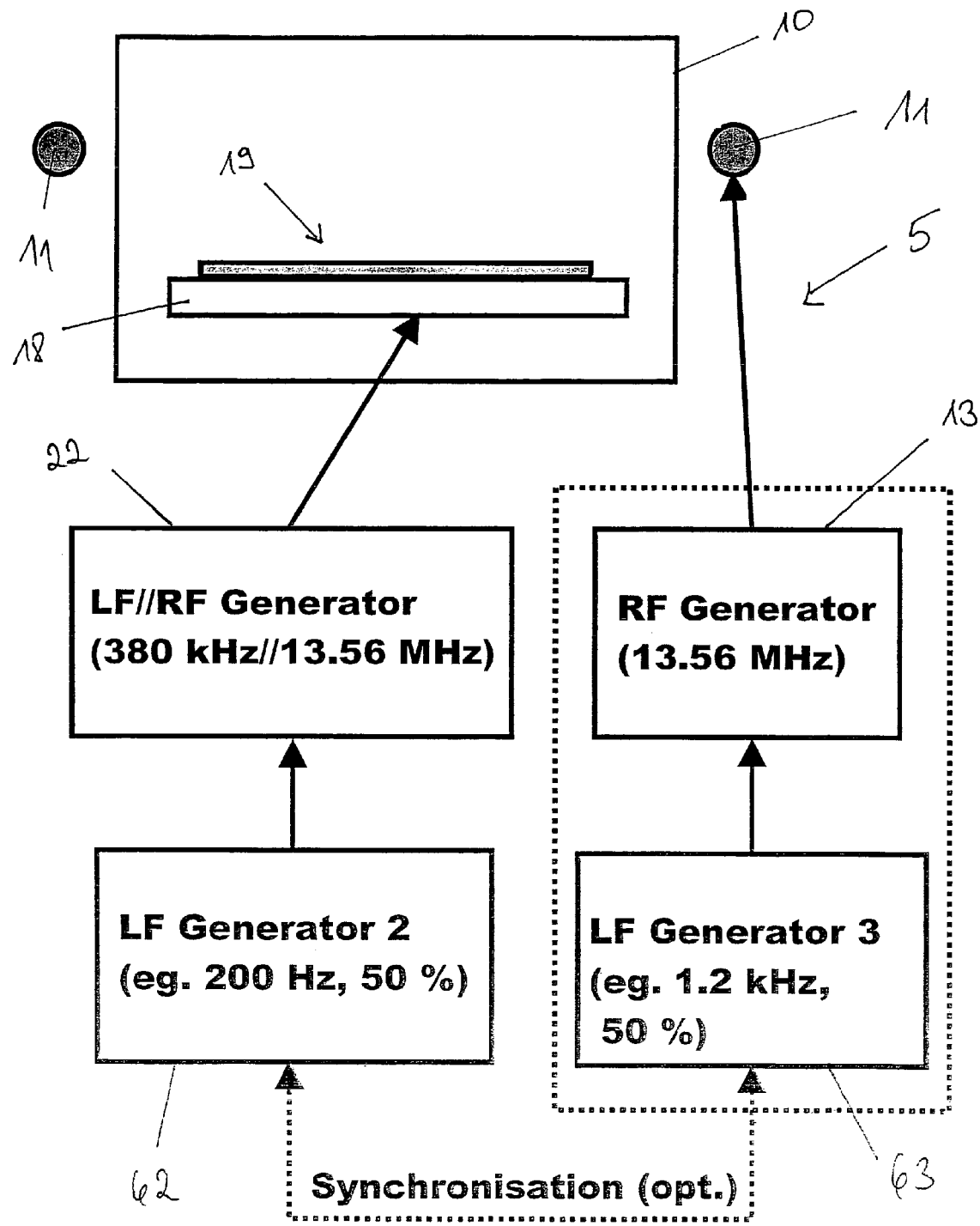
FIG. 3 shows a diagrammatic sketch of a first exemplary embodiment of a plasma etching system and its control via a coupled pulse technique on the plasma source and substrate.

FIG. 3 shows an inductively coupled plasma source 5 according to FIG. 1 in German Patent Application No. 101 45 297 having a plasma generator 13, which is preferably operated at a frequency of 13.56 MHz, for supplying power to an inductive coil 11, and a high-frequency or low-frequency generator as substrate power generator 22, which is preferably operated at a frequency of 13.56 MHz or 380 kHz to supply power to substrate electrode 18. Substrate power generator 22 and plasma generator 13 are both connected to or equipped with a pulse generator 62, 63, preferably a low-frequency pulse generator, in order to thereby pulse the power of the particular assigned generator 13, 22 at a frequency of preferably 200 Hz in the case of substrate power generator 22 or 1.2 kHz in the case of plasma generator 13 and a duty cycle of preferably 50%. Optional synchronization of two pulse generators 62, 63 and/or two generators 13, 22 also makes it possible to establish a fixed integral phase ratio between the pulse train injected into substrate electrode 18 and that injected into coil 11, thus resulting in a "stationary" pattern of the two pulse trains in relation to one another.

Figure 4:
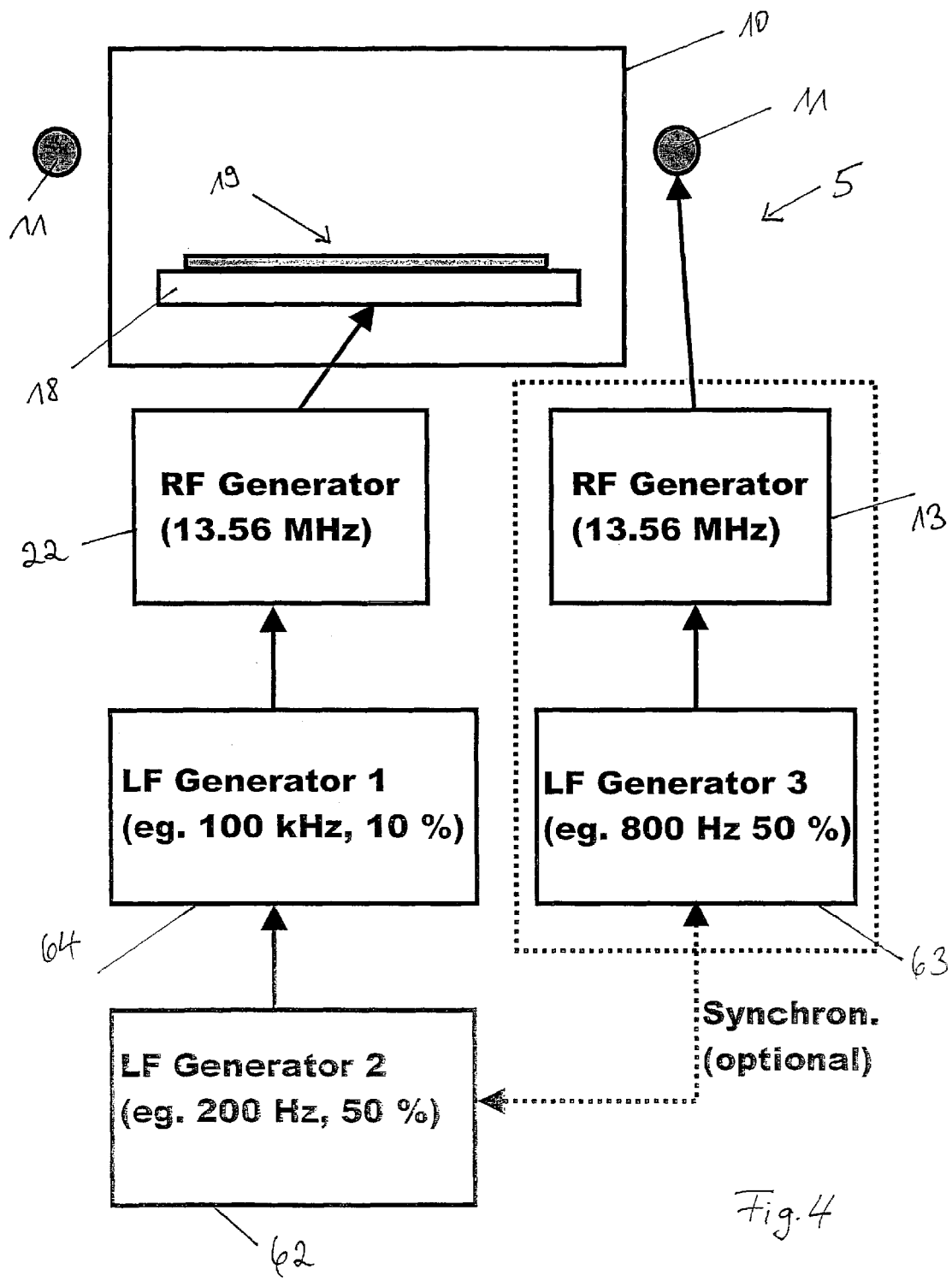
FIG. 4 shows a second exemplary embodiment as an alternative to that in FIG. 3, including double-pulse technique on the substrate electrode according to German Published Patent Application No. 199 57 169.

In continuation of FIG. 3, FIG. 4 shows a particularly advantageous embodiment, in which substrate bias generator 22 is additionally pulsed by an additional pulse generator 64 at a preferred frequency of 100 kHz and a lower duty cycle of preferably 10% in addition to the low-frequency modulation by pulse generator 62 in comparison with FIG. 3. Here again, a synchronization unit may be provided to set a fixed integral phase ratio between the pulse train injected into substrate electrode 18 and that injected into coil 11, so that here again a "stationary" pattern of the two pulse trains in relation to one another is obtained.

Figure 5:
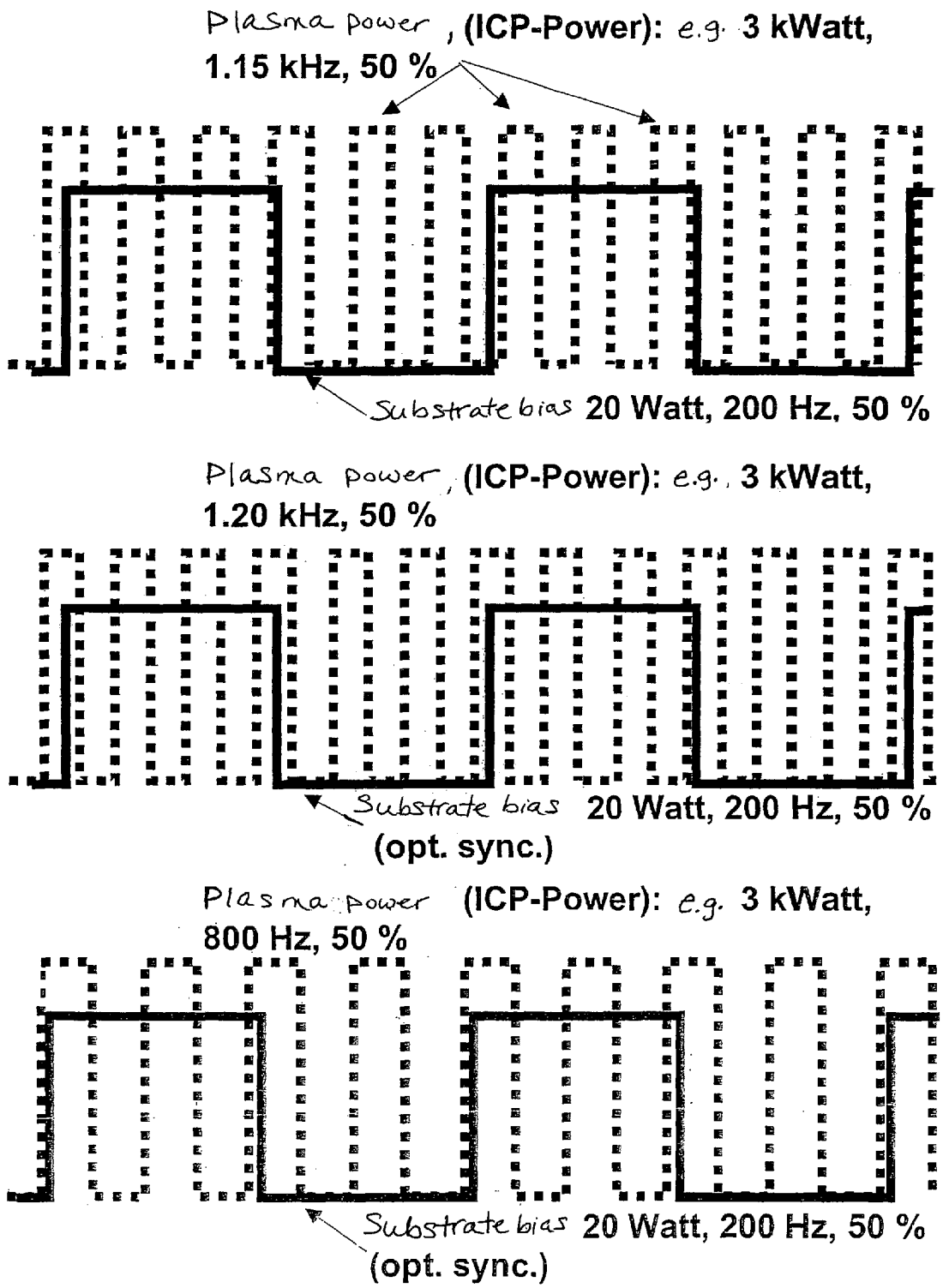
FIG. 5 illustrates three alternative pulse trains for pulsing the plasma power and the substrate power according to FIG. 3 or FIG. 4.

FIG. 5 shows various preferred variants of pulsing the envelope of carrier signal 34 by plasma generator and substrate bias generator 13, 22 for the arrangements according to FIG. 3 or FIG. 4 without regard to whether the substrate voltage is a high-frequency carrier signal, e.g., a high-frequency carrier signal pulsed at 100 kHz, or a low-frequency carrier signal, e.g., at a frequency of 100 kHz to 450 kHz. However, in FIG. 5 it is essential that during the relatively slow pulse pauses, a plurality of plasma pulses and plasma pauses occurs on the substrate electrode, the plasma becoming ambipolar during the plasma pauses and the charges on the wafer being dissipated with a high efficiency.

In the top part of FIG. 5, the plasma power, i.e., plasma generator 13, is pulsed at a frequency of 1.15 kHz and a 50% duty cycle, for example, while the substrate bias, i.e., substrate power generator 22, is pulsed at 200 Hz and a 50% duty cycle, for example.

Experiments have shown that for effective pocket suppression, the plasma pulse rate should have a frequency of at least 500 Hz, preferably 1000 Hz, or even better, a frequency in the range of 1 kHz to 10 kHz, e.g., 2000 Hz to 3000 Hz. Higher frequencies result in problems with the increased occurrence of "misfiring," i.e., plasma pulse phases during which there is no ignition of the plasma, with a correspondingly high reflected power. A plasma pulse rate of 250 Hz still resulted in pocket formation in experiments, but in no case were pockets observed at 1000 Hz.

Frequencies above a few kHz are implementable with a reasonable reflected power only by not having the plasma completely extinguished during the plasma pulse pauses but instead having it continue to burn with a low or minimal intensity, as already explained in German Patent Application No. 101 45 297. A basic ionization in the plasma associated with this may be achieved, for example, by not completely reducing the power in the pulse pauses down to 0 or by using additional means in plasma etching system 5 for a basic ionization, e.g., a low-power auxiliary generator or a high-voltage d.c. input. Moreover, for substrate electrode pulsing, it should be taken into account that in most cases, conventional inexpensive substrate bias generators 22 may be pulsed only at approximately max. 300 Hz to 500 Hz.

The diagram in the top part of FIG. 5 does not show an integral ratio between the two pulse frequencies; the ratio of the two frequencies is approx. 6. This results in a beat having a beat frequency of approx. 50 Hz.

For the process management shown here using a non-integral frequency ratio, it is advantageous if the ratio is in the vicinity of an even number, preferably at least 4, so that during a substrate bias pause there will always be at least one falling plasma pulse edge and also at least two plasma pulses and two plasma pauses per substrate bias pause and substrate bias pulse. The plasma pulse frequency is especially preferably somewhat above an even-numbered ratio of the two frequencies, and this number should again be at least 4, so that there will always be at least two falling plasma pulse edges during one substrate bias pause.

Therefore, in the top part of FIG. 5, the plasma pulse frequency should preferably be selected to be 1.25 kHz instead of 1.15 kHz as shown, i.e., somewhat above a 6:1 ratio. In this case, regardless of the phase ratio between the substrate pulsing and plasma pulsing, there are always at least three falling plasma pulse edges in the substrate bias pauses.

If an exact integral ratio between two pulse frequencies is selected in FIG. 5, this offers the possibility of synchronization of pulse generators 62, 63 according to FIG. 3 or FIG. 4. This may be accomplished, for example, by the fact that plasma pulse generator 13 runs freely, its pulse characteristic being picked up in a suitable manner, e.g., by a connected HF demodulator or a pulse signal, and pulse generator 62 for substrate power generator 22 according to FIG. 3 is phase-locked at an integral fraction of this frequency with the plasma pulse signal picked up. This is preferably accomplished by a phase-locked loop (PLL) whereby pulse generator 62 of substrate power generator 22 is kept phase-locked at a fraction of the plasma generator frequency, or by using a conventional synchronization circuit. As an alternative, it is also possible to pass the plasma pulse frequency through a digital scaler and thereby generate a signal at a fraction of the plasma pulse frequency. Digital scalers make it particularly simple to establish frequency ratios corresponding to a power of two. However, using programmable scalers, any other scaler ratio, preferably even-numbered, is also possible. Finally, it is also possible to pulse substrate power generator 22 at a low frequency at first and to derive from that an n-fold frequency for pulsing plasma generator 13. A phase-locked loop (PLL) or any other technique for frequency multiplication is also suitable for this purpose.

The middle part of FIG. 5 shows a 6:1 frequency ratio, where plasma generator 13 is pulsed at 1.2 kHz and substrate bias generator 22 is pulsed at 200 Hz. The phases of the two pulse generators are synchronized with one another so that exactly three falling plasma pulse edges occur during the substrate bias pauses.

The bottom part of FIG. 5 shows a 4:1 frequency ratio between plasma pulse generator 63 and substrate bias pulse generator 62. The phases of the two pulse generators 62, 63 are locked so that exactly two falling plasma pulse edges occur during the substrate bias pulse pauses. Due to the phase synchronization of the two pulse generators 62, 63, there is no beat here; instead, the number of falling plasma pulse edges during the substrate bias pauses is now a fixed quantity. This also allows operation with a frequency ratio of 2:1 and at least one falling plasma pulse edge during the substrate bias pause at a well-defined point in time.

The pulse techniques illustrated in FIG. 5 are suitable in particular for a substrate power generator 22, which is limited in its upper cut-off frequency to 300 Hz, for example, i.e., to relatively low pulse frequencies. This is the case of most of the simple and inexpensive low-power generators. To this extent, only plasma generator 13 in these examples should be capable of processing high pulse frequencies of 1000 Hz or more.

On the other hand, expensive high-power generators, e.g., 5500 watts, which in general also have a much more complex electronic design, frequently offer the possibility of rapid pulsing without a considerable additional cost.

One advantage of rapid pulsing is that during the relatively slow substrate bias pauses, plasma pulses are repeated several times. Since a high anion concentration is also generated at each falling plasma pulse edge according to FIG. 2, an ambipolar state in the plasma is repeated several times during the substrate bias pause, permitting highly efficient discharge of charge agglomerations on the substrate.

However, it is a disadvantage that such plasma pauses also occur at times when the substrate bias generator is turned on. Substrate electrode 18 is negatively biased due to the self-biasing effect explained above because of the applied substrate power, so anion concentrations that are generated with a falling plasma pulse edge at these times and are maintained during the subsequent plasma pause as well as subsequent ambipolar plasma states do not result in efficient discharge of substrate 19.

Instead, due to the comparatively high self-bias voltage on substrate electrode 18 during the phases in which the plasma is cycled out, i.e., has a very high impedance, there is actually an unwanted ion acceleration which may result in profile disturbances. Furthermore, the operating state described here suggests a duty cycle, i.e., a pulse-period ratio of 50%, namely for both plasma generator 13 and substrate bias generator 22. This means high required peak powers of plasma generator 13, in particular when high etching rates are desired at the same time, i.e., a high average power is needed for generating chemically active radicals in the plasma. For a high-rate etching process, which requires an average of 2.7 kW plasma power over time, a pulse power of 5.4 kW or more is needed at a 50% duty cycle.

However, if the duty cycle parameter is increased, the plasma pulse pauses effectively available during a substrate bias pause are substantially shortened, which has a negative effect on pocket suppression efficacy.

Ultimately this mode of operation of two generators 13, 22 does not optimally utilize the pause time available at substrate electrode 18, because not just a plasma pause but also a plasma pulse falls in the substrate bias pause.

Experiments have also shown that it is a disadvantage for pocket stability if the absolute plasma "on" times during a substrate bias pulse phase add up to values of more than 1 ms, in particular more than 2 ms. Although there is a certain discharging of structures between the individual plasma pulses even while substrate electrode 18 is receiving power, this is comparatively minor, however, and is far from achieving the efficiency of an ambipolar state.

The situation in the bottom part of FIG. 5 with a plasma pulse rate of 800 Hz and a substrate bias pulse rate of 200 Hz, both with a 50% duty cycle, is thus borderline with regard to total plasma "on" times of 1.25 ms during a substrate bias pulse.

The ambipolar plasma state occurring in the plasma pulse pauses cannot be used for a highly efficient discharge of the substrate because of the negative substrate bias voltage applied at the same time, so charge quantities occurring during a substrate bias pulse over the plurality of plasma pulses accumulate at the relevant sites on the substrate without any truly significant reduction in the amount of these charges in the plasma pauses in the meantime. A certain improvement or reduction with regard to the amount of charges accumulated during a substrate bias pulse may be achieved in this situation if the plasma pulse frequency is not selected as an even-numbered multiple (2n) of the substrate bias pulse frequency but instead as an odd-numbered multiple (2n+1) and if in addition the plasma pulse train is synchronized with the substrate bias pulse train so that only n plasma pulses fall in a substrate bias pulse, while n+1 plasma pulses occur during a substrate bias pause. In this way, charge accumulates on substrate 19 only over n plasma pulses during the substrate bias pulse phase (corresponding to n+1 plasma pauses), while n+1 plasma pulses and accordingly only n−1 plasma pauses occur during the substrate bias pause. However, synchronization of the two pulse trains is absolutely to be recommended in the case of an odd-numbered frequency ratio.

However, the unwanted charge accumulation in operating states during which substrate bias generator 22 and plasma generator 13 are supplying a pulse at the same time ultimately necessitates a reduction in the duty cycle parameter for both generators 13, 22 in the interest of pocket stability so that first the substrate bias pulses may be kept as short as possible in relation to the substrate bias pauses and also the plasma pulses are kept short in relation to the plasma pauses. However, the latter measure is a disadvantage for the chemical activity of the plasma with respect to generation of radicals, i.e., it is preferable at this point to maintain a value of at least 50%.

Taking into account the findings presented above, an optimum situation is obtained when the substrate bias pulses are selected to be so short that no harmful amount of charges is allowed to accumulate on substrate 19 during a substrate bias pulse, and if the plasma pulses are synchronized with the substrate bias pulses so as to yield the shortest possible plasma pause, i.e., exclusively during a substrate bias pause at the highest possible duty cycle of 50% to 90%, preferably 80%. In this case the plasma pause is utilized optimally because it falls completely in a substrate bias pause, and a maximum duty cycle value for plasma pulsing and thus a high plasma excitation are possible. The substrate bias duty cycle may also be selected independently, taking into account the boundary condition with regard to the coincidence of two pause times, e.g., at values between 25% and 75%, preferably 50%.

A particularly advantageous process management therefore involves the use of a rapidly pulsable substrate bias generator 22, e.g., of the type RF10-S/PWT from the company RFPP, having a cut-off frequency of 100 kHz, for example. It may in each case be pulsed with the same frequency as plasma generator 13.

Figure 6:
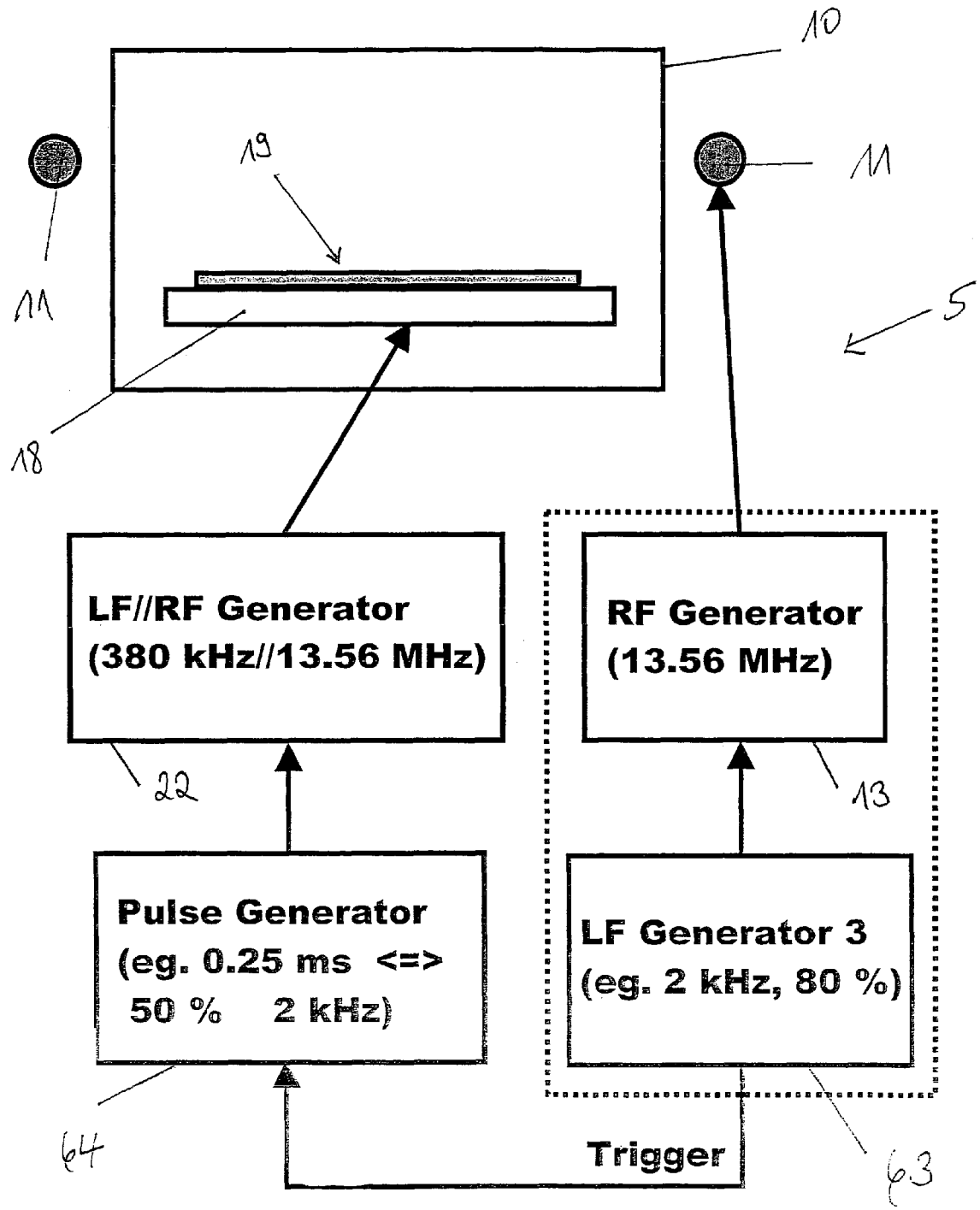
FIG. 6 shows a third exemplary embodiment as an alternative to that in FIG. 3 or FIG. 4.

FIG. 6 illustrates a corresponding exemplary embodiment in which a trigger signal for pulse generator 64 is derived from the pulse train of plasma generator 13 via pulse generator 63 or by using an HF demodulator; this trigger signal may be used to generate pulses of a variable length which are used for pulsing substrate bias generator 22 with the same frequency as the trigger signal and a fixed phase ratio to plasma generator 13.

Plasma generator 13 according to FIG. 6 is preferably pulsed at a frequency of 2 kHz and a duty cycle of 80%, so that substrate power generator 22 also operates with this frequency and a pulse length of 0.25 ms, for example, which corresponds to a duty cycle of 50%.

Figure 7:
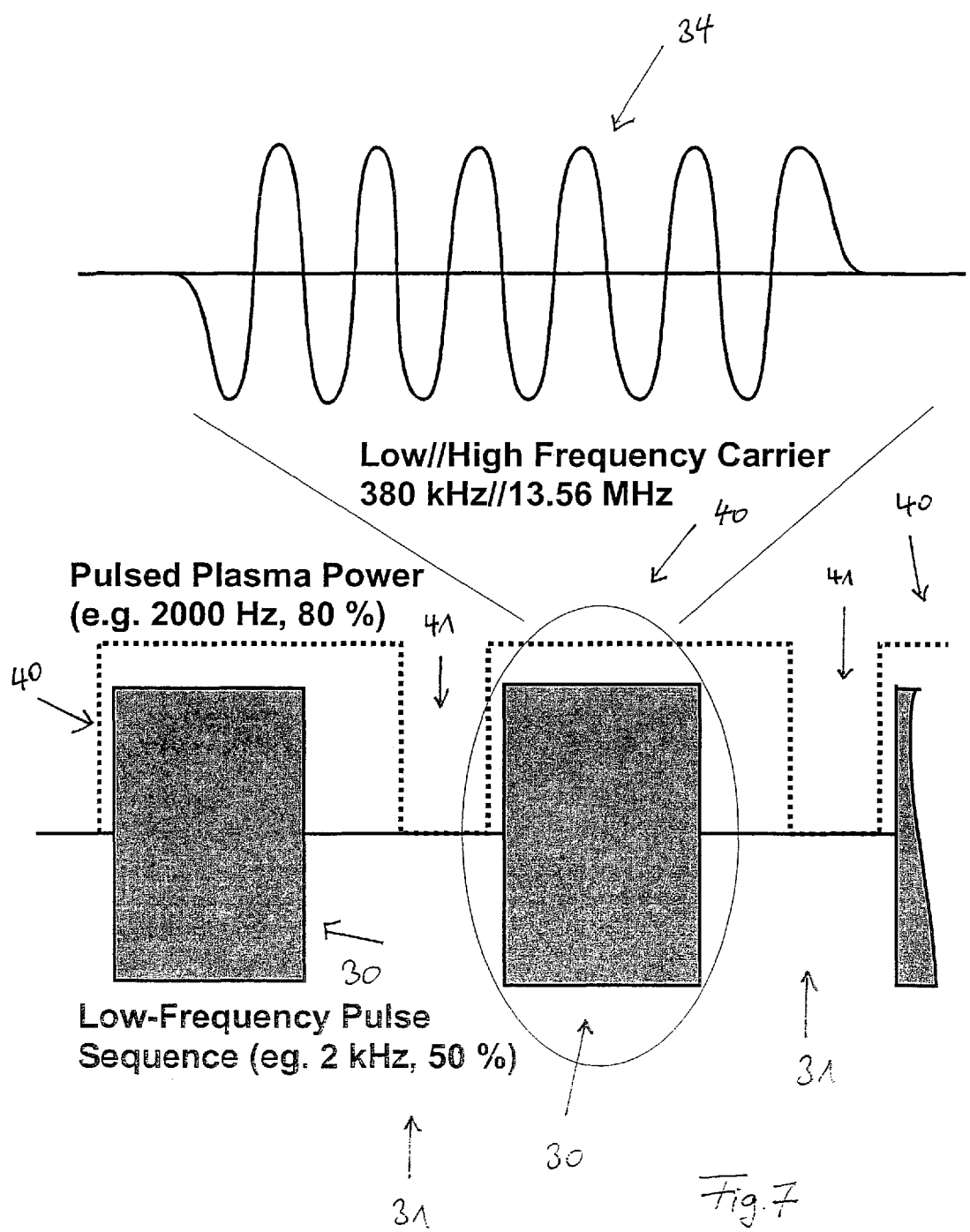
FIG. 7 shows the structure of pulse trains for pulsing the plasma power and the substrate voltage according to FIG. 6.

FIG. 7 shows the pulse scheme assigned to FIG. 6, an understanding of which will also be apparent to those skilled in the art from FIG. 2 and/or FIG. 3 in German Patent Application No. 101 45 297 and the explanations presented there in addition to the explanations given here.

Specifically, according to FIG. 7, a substrate bias pulse 30 coinciding with the output signal of plasma generator 13 for the first 0.25 ms of plasma pulse 40 is generated at the output of plasma generator 13 with the rising edge of the signal envelope, i.e., plasma pulse 40. Then the substrate bias value drops to 0 while plasma generator 13 is still delivering a high frequency to the plasma and ensuring the generation of chemically active, e.g., etching and/or passivating radicals. During this period of time, there is already a certain discharge of charge buildup on substrate 19, although it is not very efficient. Only with the shutdown of plasma generator 13 during substrate bias pause 31 and the start of plasma pulse pause 41 does the ambipolar plasma state occur with a high anion concentration according to FIG. 2, i.e., all the charge buildup on substrate 19 is not dissipated with a high efficiency because the plasma and substrate 19 have an almost identical potential of approx. 0 volt.

Figure 8:
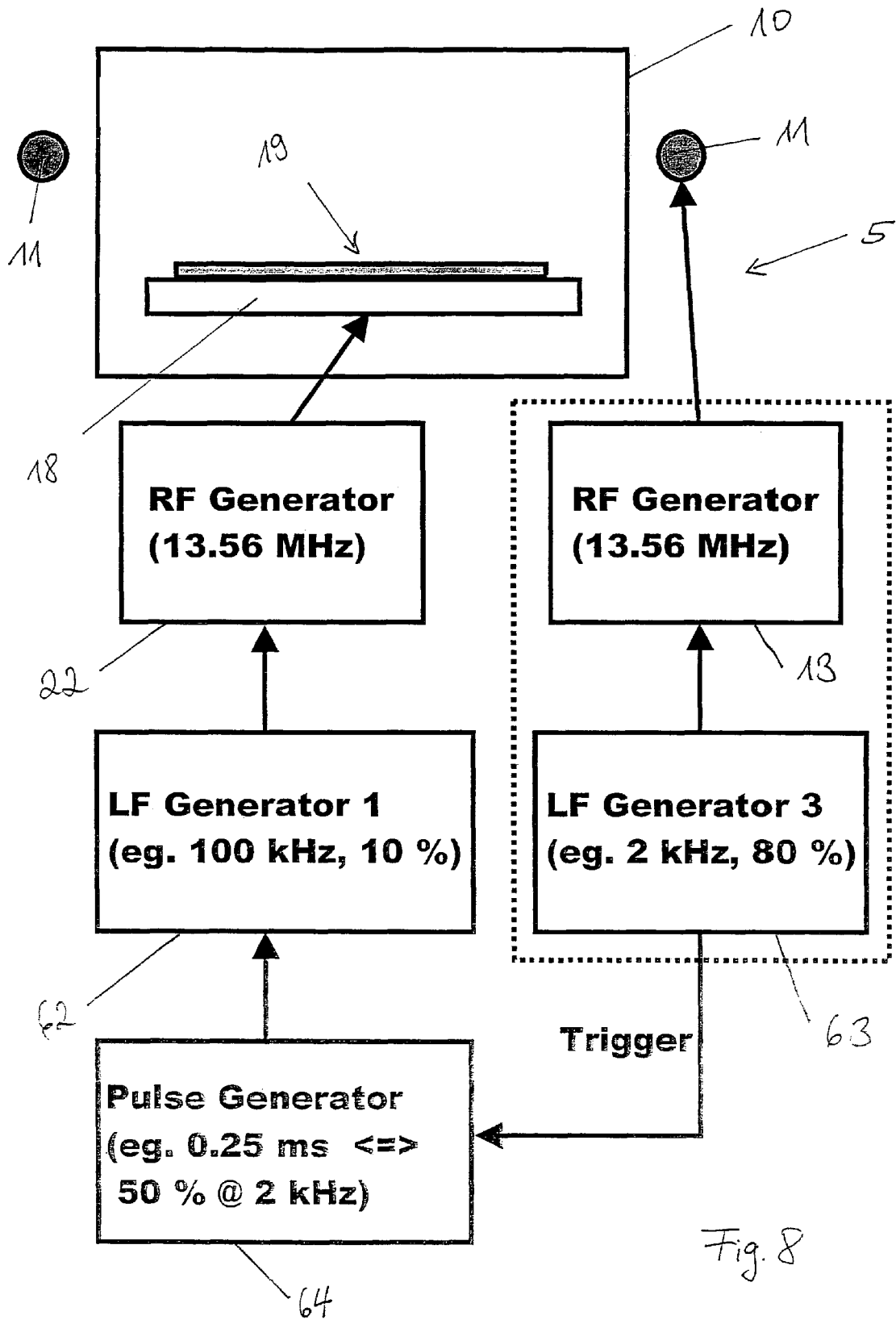
FIG. 8 shows a fourth exemplary embodiment as an alternative to FIG. 3, FIG. 4 or FIG. 6.

FIG. 8 shows the situation according to FIG. 7 in double pulsing of substrate electrode 18 in the manner described in German Published Patent Application No. 199 57 169. By rapid modulation of a substrate power generator 22, which is operated at 13.56 MHz, for example, via pulse generator 62 at 100 kHz and a 10% duty cycle, a low-frequency biasing is emulated, i.e., the essential advantages of low-frequency biasing are obtained without having to accept its disadvantages. High-frequency carrier signal 34 of substrate bias generator 22 which is thus modulated rapidly is also pulsed according to FIG. 8 via low-frequency pulse generator 64 in the kHz range with a duty cycle of 25% to 75%, e.g., 50%. The trigger for this pulse generator 64 may in turn be a signal derived from the pulse train of plasma generator 13. An HF demodulator is preferably used for this purpose to generate a voltage proportional to the envelope from the high-frequency output signal of plasma generator 13. Plasma generator 13 is also preferably pulsed at a repetition rate of 1 kHz to 3 kHz, preferably 2 kHz with a duty cycle of 80%. Pulse generator 64 on the substrate side is also operated at this frequency and a duty cycle of 50%, corresponding to a pulse time of 0.5 ms. The fixed phase ratio between two pulse trains, i.e., pulse generators 63, 64 is derived from the type of trigger. Moreover, it is readily possible within the scope of the example explained here to use other methods of frequency locking and phase locking of the two pulse generators 63, 64, i.e., pulse trains, such as a synchronization circuit of two free-wheeling pulse generators or a PLL circuit.

Figure 9:
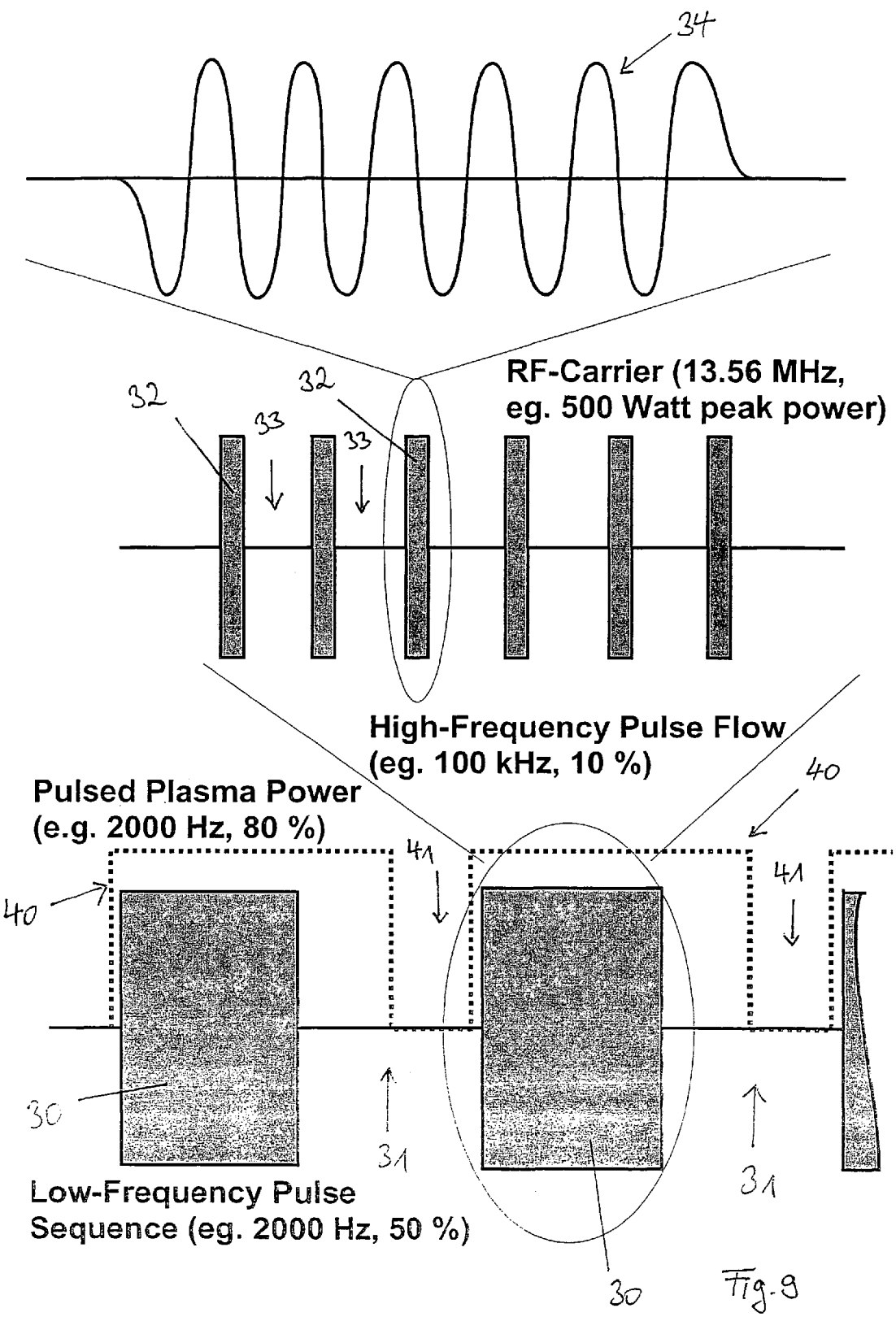
FIG. 9 shows the structure of pulse trains for pulsing the plasma power and the substrate voltage according to FIG. 8.

FIG. 9 shows the pulse scheme associated with FIG. 8 in a manner similar to FIGS. 6 and 7. The substrate bias pulse train having a 2 kHz repetition rate and a 50% duty cycle, here is enveloped by the plasma pulse train having an 80% duty cycle, e.g., the synchronization, i.e., trigger circuit ensuring that plasma pulse pause 41 always occurs at a well-defined point in time during substrate bias pause 31.

Here again, the rising edge of the signal of plasma generator 13 may be used as the trigger which triggers substrate bias pulses 30 and 32. According to FIG. 9, plasma generator 13 also supplies plasma pulse 40, while the substrate bias voltage has already been turned off. Since the plasma in this state is still approx. 10 V to 20 V above the substrate potential, discharge processes on substrate 19 are already beginning to dissipate harmful charges but these processes are not particularly effective for the reasons given above. However, with the shutdown of plasma generator 13, i.e., in plasma pulse pause 41, a high anion concentration occurs, releasing the electrons as negative charge carriers, i.e., an ambipolar plasma state develops. At this point in time the substrate bias voltage is still turned off, so highly efficient discharge processes are now able to begin, completely dissipating the harmful charges on substrate 19 within the shortest possible period of time. Thus, FIG. 9 in conjunction with FIG. 8 illustrates a particularly preferred exemplary embodiment of the present invention.

In particular in FIG. 9 the "on" and "off" times of the two generators 13, 22 have been optimally combined, so there are no useless plasma "off" states, while the substrate bias voltage is still "on."

The only other difference between FIG. 9 and FIG. 7 is that the high-frequency pulse train on substrate electrode 18 also has a rapid modulation at 100 kHz, for example, and a very low duty cycle of 10%, for example, so that the advantages of low-frequency biasing may be utilized without having to accept its disadvantages.

The pulse frequencies for substrate bias pulses 30 and plasma pulses 40, each of which is the same in FIGS. 6 through 9, should not be less than 250 Hz in general. A frequency of 500 Hz is borderline with respect to the desired suppression of pockets because above a frequency of 1000 Hz no more pocket formation is observed at a dielectric interface as an etch barrier, even in the case of overetching of 200%, in narrow trenches having a high aspect ratio. Frequencies of 1000 Hz to 10,000 Hz, e.g., 2000 Hz to 3000 Hz are particularly preferred. It should be noted here that at higher frequencies, plasma misfiring together with a high reflected power occurs more and more frequently, although that can be corrected with the measures already described in German Patent Application No. 101 45 297.

It has also proven to be particularly advantageous if a light and/or easily ionizable inert gas, preferably helium, is permanently added to the plasma in the ambipolar plasma phases without a substrate bias voltage, e.g., according to FIG. 7 or FIG. 9. In the ambipolar biasless state, ionized helium atoms are very easily deflected by electric charges and are able to discharge them especially well if they have a suitable polarity. To this extent, helium is ideally suited for "tracking" and discharging harmful charge agglomerations on substrate 19 because of its low mass. On the other hand, a small amount of helium added, amounting to a few percent of the total gas flow, preferably max. 10% to 15% of the total gas flow even if added permanently, does not interfere with the plasma, but on the contrary actually stabilizes the discharge. However, helium is truly effective only in ambipolar biasless phases because only then are the charging effects "visible" and capable of being neutralized by suitably low-energy ions which otherwise, i.e., in the absence of the ambipolar plasma state, would not even reach substrate 19.

An application of the exemplary embodiments explained above pertains in particular to the suppression of pocket formation on a dielectric interface 60 in etching silicon, for example, as already explained above with the help of FIG. 1. In the ambipolar plasma and biasless substrate state, negatively charged ions (anions) having a low energy reach the dielectric etching base of etched structures charges by positive ions and are able to neutralize harmful charges. At the same time, positively charged ions having a low energy are also able to penetrate into trenches that have been created with a high aspect ratio, where they discharge quantities of electrons that have accumulated in the area of the side walls near the dielectric etch barrier.

Figure 10:
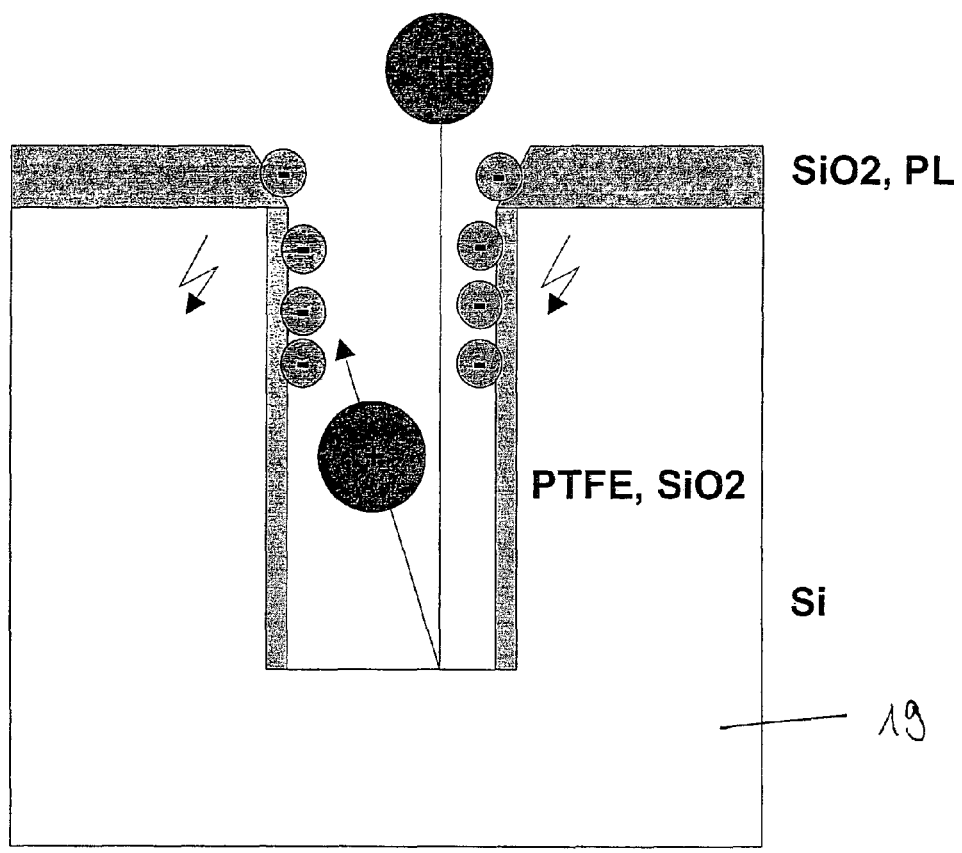
FIG. 10 illustrates the accumulation of electrons in the upper portion of a trench provided with side wall passivation or near the edge of a mask and pocket formation in plasma etching.
Figure 10:
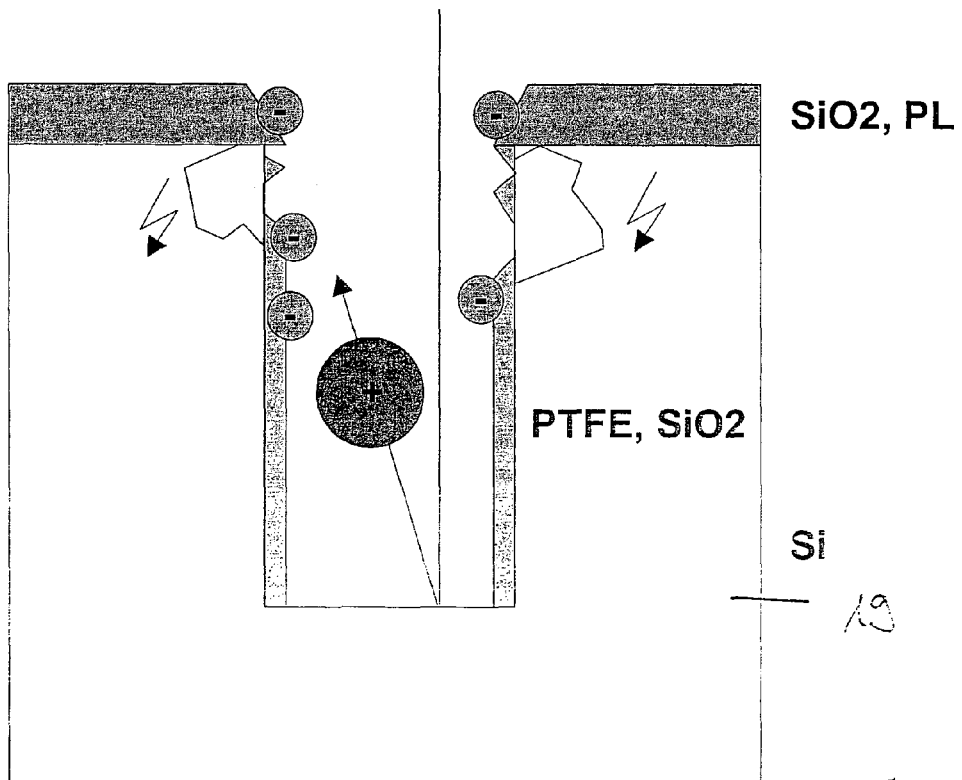

Another application of the exemplary embodiments described above and at the same time a situation which has previously been found in plasma etching are illustrated in FIG. 10: an undirected incidence of low-energy electrons and directed ions having an energy of at least 10 eV to 20 eV (plus the self-biasing voltage explained above) result in the occurrence of electron accumulations in the upper portion of trenches near the edge of the mask. The edges of the mask of photoresist (PL) or $SiO_2$ form an insulator on which electrons are trapped. In addition, side wall passivation in most etching processes for silicon involves a more or less insulating material, even in processes which do not explicitly include deposition of a layer.

Thus in addition to the deposition of side wall films, e.g., of Teflon-like materials (PTFE) according to German Patent No. 42 41 045, some processes also rely on oxidation or nitrification of the side walls to protect them from etching attack. In particular, processes based on chlorine or bromine or cryogenic silicon etching processes are known, based on $SiO_2$ type side wall protective films or oxidation of the side walls on an atomic level.

In any case, these protective films are electrically insulating at least locally and may develop electric accumulations in spots or even over entire areas, i.e., they form electrically charged insulating islands, which are often located near the trench inlet opening but occasionally are also simply distributed in spots on the side wall.

These electrically charged islands produce strong electric fields which attract "transverse strikes," i.e., positive ions that are reflected by the etching base and are additionally accelerated into the charged areas. Such "ricochets" result in damage to the side wall passivation and in underetching of the area in question. On the whole, this mechanism leads to undercutting beneath the edge of the mask, especially in high-rate etching of silicon, and also results in irregular gap-like or hole-like penetration of the side wall passivation which occurs spontaneously on the side wall of deeply etched structures, as illustrated in the bottom part of FIG. 10.

These unwanted effects may be effectively suppressed with the process management explained according to the present invention because in the case of an ambipolar plasma in conjunction with a biasless substrate state which is repeated periodically, ions (anions and cations) of a very low energy are able to track charges and neutralize them everywhere in the trench, the ion energies being so low that they are unable to cause any damage—at least if this ambipolar biasless state is ensured so rapidly in succession that no harmful electric fields are able to build up in the meantime.

Moreover, the addition of He mentioned above has proven to be particularly effective for "tracking" and neutralizing charges adhering to spots on the side wall. This makes very deeply etched profiles more stable, the side wall is no longer penetrated by holes and gaps, and underetching beneath the mask is prevented.

Another application of the exemplary embodiments explained above pertains to a preliminary process for sacrificial layer etching in silicon with the help of fluorine radicals or a highly oxidizing fluorine compound, preferably $ClF_3$, such as that proposed in German Patent No. 44 20 962 or German Published Patent Application No. 198 47 455.

Figure 11:
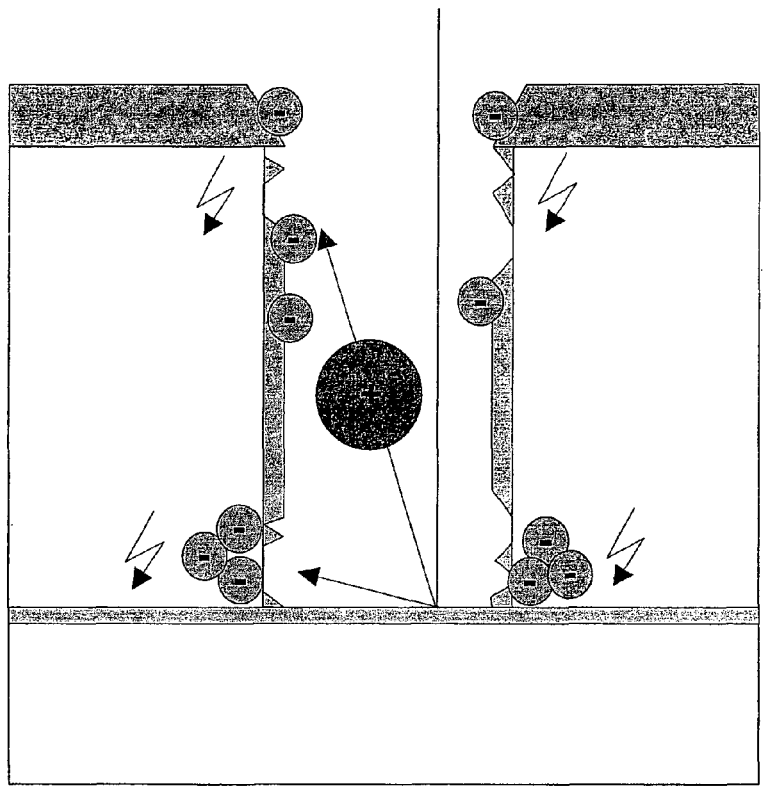
FIG. 11 illustrates the mechanism of damage to side wall passivation in opening of base passivation of a trench with subsequent locally undesirable isotropic etching of side walls with $ClF_3$.
Figure 11:
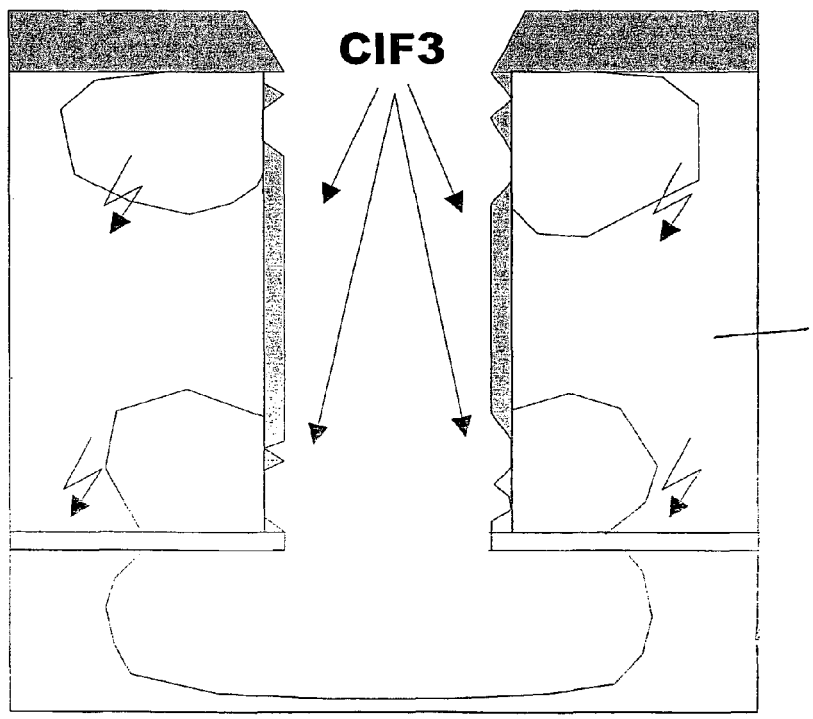

FIG. 11 shows in the top part how the side wall of a previously anisotropically etched silicon structure has been covered with a passivation layer deposited, for example, as an $SiO_2$ layer or as a Teflon-like layer similarly to the side wall passivation according to German Patent No. 42 41 045. Before applying the Teflon-like layer, in the interest of good adhesion to the silicon, it is also preferably overetched briefly, e.g., with the help of a plasma etching step using $CF_4$ or $C_2F_6$ to purify the silicon surface by partial etching thereof, freeing it of oxide, activating it and initializing it with fluorocarbon bonds before then depositing the Teflon layer with the help of a plasma on the activated surface in situ with the help of $C_4F_8$, $C_3F_6$ or $C_4F_6$. This layer then covers both the side wall and the bottom of the etched structure and is electrically insulating. Before a sacrificial layer etching is able to then take place, this passivation at the etching base is first penetrated, thus providing access to a sacrificial layer of silicon without damaging the side wall passivation. This is accomplished, for example, with an oxide etching process based on $C_2F_6$, $C_4F_8$, $CF_4$ using $CHF_3$ or $CF_4$ with the help of an etching process for removing the Teflon-like side wall passivation, e.g., based on $O_2$, $CF_4$ or $C_2F_6$ or as an alternative simply by sputtering with argon or an argon-helium mixture as the process gas.

In this method, the electric charge buildup phenomenon described above often occurs on the dielectric side wall passivation, i.e., either a layer of $SiO_2$ or a Teflon-like material, resulting in deflection of ions and damage to the side wall film. This damage occurs primarily in the upper part of the structures and on a dielectric dividing layer in the lower part of the structures, in particular in trenches having high aspect ratios.

In a subsequent sacrificial layer etching process, preferably using gaseous $ClF_3$, this damage then results in uncontrolled etching of the silicon, which is actually to be protected by the side wall films, according to the bottom part of FIG. 11. This damage mechanism is a limiting element in the silicon-based sacrificial layer technique, i.e., the process window has so far been greatly limited in particular with regard to achievable aspect ratios of trenches, which may still be passivated reliably.

With the method according to the present invention, which may be further improved by the addition of helium, these problems are overcome and a wide process window is also opened for the $ClF_3$ sacrificial layer technique and/or its pre-process, i.e., opening a bottom passivation of a trench.

Finally, the consequences of electric charges in etching dielectrics, e.g., thick oxide layers or nitride layers, will be explained with the help of FIG. 12. In the past, mainly thick dielectrics structured with a high aspect ratio by a plasma etching process have had many profile disturbances in the upper portion of the profiles due to buildup of electric charges, i.e., essentially trapped electrons in the insulator material, resulting in high fields and ion deflection with the subsequent damage.

Figure 12:
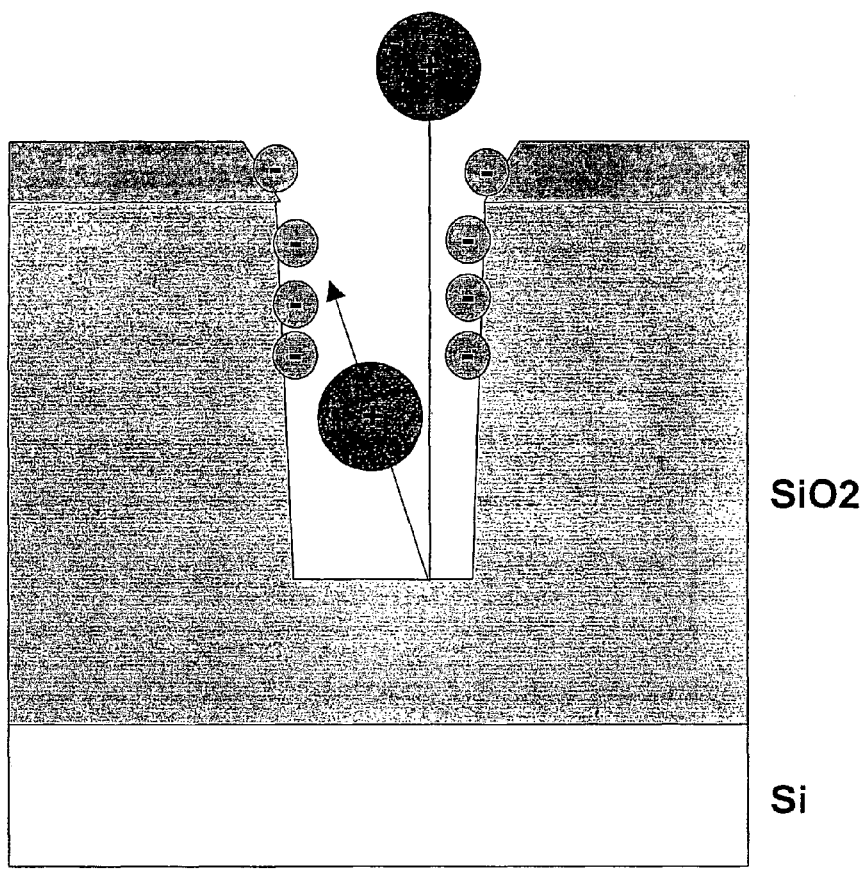
FIG. 12 shows the possible consequences of an electric charge buildup in etching of dielectrics.
Figure 12:
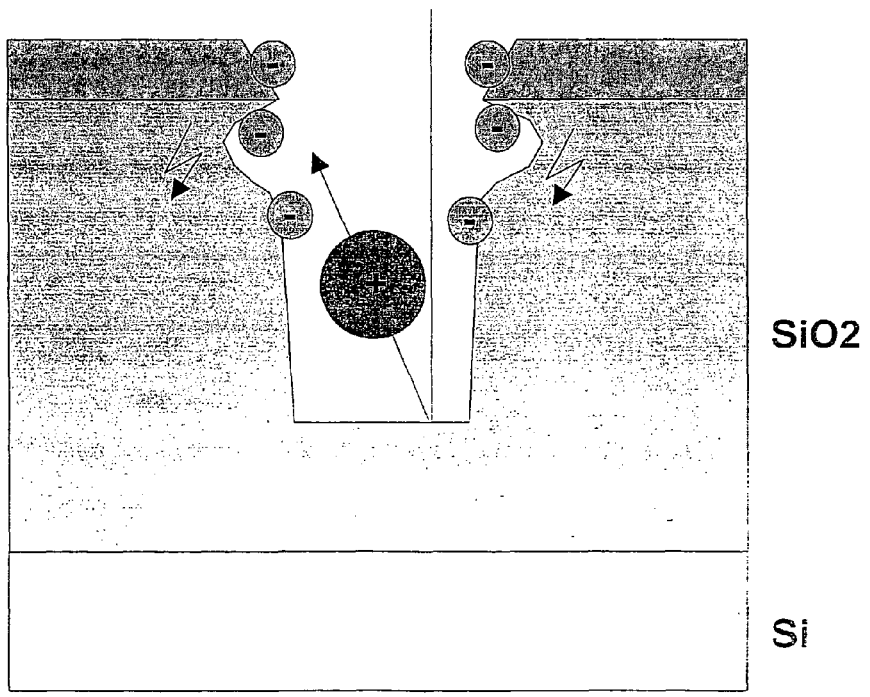

In the past, such profile disturbances have been counteracted by accepting an increased mask erosion and faceting of the etching mask to protect the upper portion of the etching trenches to a greater extent by the entrainment of mask material that has been eroded and to thereby prevent the profile disturbances indicated in the lower portion of FIG. 12. Faceting of the edge of the mask, controlled withdrawal of the mask away from the opening of the etching trench, is thus another means for masking profile problems in the upper part of the etching trench.

These problems are also eliminated by the method according to the present invention. During the biasless phases on substrate electrode 18, the plasma becomes ambipolar temporarily due to blanking out, i.e., ions (anions and cations) of a very low energy are now able to reach the interior of the etching trenches and effectively track down charges that have accumulated there and neutralize them. The lightest possible ions, e.g., helium ions are especially suitable for this purpose.

Between substrate 19 and the ambipolar plasma there is no longer a potential difference, so even minimal electric fields are sufficient to attract ions from the ambipolar plasma to the corresponding charges causing the fields and neutralize them. Therefore, charges are dissipated promptly and efficiently before reaching an order of magnitude at which the electric fields induced by them will result in ionic damage.

What is claimed is:

1. A method of etching a structure into an etching body using a plasma, comprising:
   injecting a high-frequency power into the etching body via a substrate electrode; and
   refraining from injecting the high-frequency power into the etching body via the substrate electrode in response to an at least approximately ambipolar plasma being present.

2. The method as recited in claim 1, wherein:
   the etching body includes a silicon body, the structure is a recess in the silicon body that is laterally defined in a precise manner by an etching mask, using the plasma, a high-frequency pulsed, low-frequency modulated high-frequency power is injected at least temporarily into the etching body via a high-frequency AC voltage, using the substrate electrode, and the plasma is modulated in its intensity as a function of time.

3. The method as recited in claim 2,
wherein: the plasma is pulsed.

4. A method of etching a structure into an etching body using a plasma, comprising:
   injecting a first pulse train into the etching body via a substrate electrode; and
   injecting a second pulse train into the plasma for modulating a plasma intensity over time, wherein:
      the first pulse train has a frequency that differs from a frequency of the second pulse train, and
      a fixed, integral ratio exists between the frequency of the first pulse train and the frequency of the second pulse train.

5. The method as recited in claim 4, wherein:
   the etching body includes a silicon body,
   the structure is a recess in the silicon body that is laterally defined in a precise manner by an etching mask, using the plasma,
   a high-frequency pulsed, low-frequency modulated high-frequency power is injected at least temporarily into the etching body via a high-frequency AC voltage, using the substrate electrode, and
   the plasma is modulated in its intensity as a function of time.

6. The method as recited in claim 5,
wherein: the plasma is pulsed.

7. A method of etching a structure into an etching body using a plasma, comprising: performing a first pulsing of the plasma at a frequency of at least 500 Hz, wherein:
   the etching body includes a silicon body,
   the structure is a recess in the silicon body that is laterally defined in a precise manner by an etching mask, using the plasma,
   a high-frequency pulsed, low-frequency modulated high-frequency power is injected at least temporarily into the etching body via a high-frequency AC voltage, using a substrate electrode, and
   the plasma is modulated in its intensity as a function of time.

8. The method as recited in claim 7, wherein:
the first pulsing of the plasma is at a frequency of 1 kHz to 10 kHz.

9. The method as recited in claim 7, further comprising:
performing a low-frequency pulsing of the high-frequency pulsed, low-frequency modulated high-frequency power, wherein:
   the first pulsing of the plasma and the low-frequency pulsing of the high-frequency pulsed, low-frequency modulated high-frequency power are performed at the same frequency and with a fixed phase ratio between the first pulsing and the low-frequency pulsing in such a way that a plasma pulse pause occurs during a pause between low-frequency pulses of the low-frequency pulsing.

10. A method of etching a structure into an etching body using a plasma, comprising:
at least at one time at which an at least approximately ambipolar plasma is present, adding to the plasma an inert gas that is at least one of light and easily ionizable.

11. The method as recited in claim 10,
wherein: the inert gas includes helium.

12. The method as recited in claim 11, wherein:
the helium is added at least at one point in time at which no high-frequency power is being injected into the etching body via a substrate electrode.

13. The method as recited in claim 10, wherein:
the etching body includes a silicon body,
the structure is a recess in the silicon body that is laterally defined in a precise manner by an etching mask, using the plasma,
a high-frequency pulsed, low-frequency modulated high-frequency power is injected at least temporarily into the etching body via a high-frequency AC voltage, using a substrate electrode, and
the plasma is modulated in its intensity as a function of time.

14. The method as recited in claim 13,
wherein: the plasma is pulsed.

15. A method of etching a structure into an etching body using a plasma, comprising:
performing a first modulation of an intensity of the plasma as a function of time;
setting as a plasma pulse frequency an odd-numbered multiple of a frequency of a low-frequency modulation of a high-frequency power injected into the etching body via a substrate electrode; and
synchronizing the first modulation and the low-frequency modulation with one another so that n plasma pulses (n=1, 2, 3, ... ) fall in each pulse injected into the etching body using the substrate electrode while n+1 plasma pulses occur during a pause in an energy injection into the etching body.

16. The method as recited in claim 15, wherein:
the etching body includes a silicon body,
the structure is a recess in the silicon body that is laterally defined in a precise manner by an etching mask, using the plasma, and
a high-frequency pulsed, low-frequency modulated high-frequency power is injected at least temporarily into the etching body via a high-frequency AC voltage, using the substrate electrode.

17. The method as recited in claim 1, wherein:
the structure includes a trench having a high aspect ratio, and
the etching body includes one of a dielectric layer and a dielectric base body.

18. The method as recited in claim 1, wherein:
the etching body includes a layer of silicon,
the structure includes a trench having a high aspect ratio,
the trench is introduced into the silicon layer, and
after a production of the trench, at least one of an isotropic underetching and an isotropic, sacrificial-layer etching is performed.

19. The method as recited in claim 18, wherein:
the at least one of the isotropic underetching and the isotropic, sacrificial-layer etching is performed using one of fluorine radicals and a highly oxidizing fluorine compound.

20. The method as recited in claim 19, wherein: the highly oxidizing fluorine compound includes $ClF_3$.

* * * * *